United States Patent
Prytz (10) Patent No.: US 10,198,334 B2
(45) Date of Patent: Feb. 5, 2019

(54) METHOD FOR MONITORING THE OPERATION OF A COMPONENT

(71) Applicant: VOLVO TRUCK CORPORATION, Göteborg (SE)

(72) Inventor: Rune Prytz, Arlöv (SE)

(73) Assignee: Volvo Truck Corporation, Göteborg (SE)

( * ) Notice: Subject to any disclaimer, the term of this patent is extended or adjusted under 35 U.S.C. 154(b) by 415 days.

(21) Appl. No.: 15/103,856

(22) PCT Filed: Dec. 13, 2013

(86) PCT No.: PCT/EP2013/003770
§ 371 (c)(1),
(2) Date: Jun. 11, 2016

(87) PCT Pub. No.: WO2015/086038
PCT Pub. Date: Jun. 18, 2015

(65) Prior Publication Data
US 2016/0321154 A1 Nov. 3, 2016

(51) Int. Cl.
*G06F 11/00* (2006.01)
*G06F 11/30* (2006.01)
(Continued)

(52) U.S. Cl.
CPC ...... *G06F 11/3013* (2013.01); *F02D 41/2409* (2013.01); *F02D 41/2425* (2013.01);
(Continued)

(58) Field of Classification Search
CPC ............. G06F 11/3037; G06F 11/3027; G06F 11/0739; G06F 11/0736; G06F 11/3013;
(Continued)

(56) References Cited

U.S. PATENT DOCUMENTS

2005/0288903 A1* 12/2005 Jackson ................... G07C 3/00
702/187
2008/0110283 A1* 5/2008 Shaver ................... G01P 3/481
73/862.328
(Continued)

OTHER PUBLICATIONS

International Search Report (dated Jun. 2, 2014) for corresponding International App. PCT/EP2013/003770.

*Primary Examiner* — Joseph D Manoskey
(74) *Attorney, Agent, or Firm* — WRB-IP LLP (57) ABSTRACT

A method for monitoring the operation of a component includes receiving a stream of data samples, wherein each data sample represents a value of a physical parameter of the component, identifying local extrema of the stream of data samples, storing information relating to each local extremum in a respective position of a fixed size buffer, and upon the presence of a cycle formed between two matching endpoints represented by two local maxima or two local minima: i) deleting at least one of the local extrema corresponding to the endpoints of the cycle from the buffer, and ii) storing information related to the cycle in a memory such that the information stored in the memory represents the operation of the component. When the buffer is full such that each position of the buffer contains information relating to a unique local extrema, the method further includes the steps of: i) deleting the information relating to the oldest local extrema from the buffer, ii) calculating a pseudo cycle formed between two endpoints of which one endpoint is represented by the deleted oldest local extrema, and iii) storing information related to the calculated pseudo cycle in the memory.

22 Claims, 5 Drawing Sheets

(51) Int. Cl.
    *G05B 23/02*    (2006.01)
    *F02D 41/24*    (2006.01)
    *G06F 13/16*    (2006.01)
    *G11C 21/00*    (2006.01)
    *G06K 9/00*     (2006.01)
    *F02D 41/00*    (2006.01)
    *F02D 41/28*    (2006.01)

(52) U.S. Cl.
    CPC ...... *G05B 23/0221* (2013.01); *G06F 11/3027* (2013.01); *G06F 11/3037* (2013.01); *G06F 13/1673* (2013.01); *G11C 21/00* (2013.01); *F02D 41/0007* (2013.01); *F02D 2041/286* (2013.01); *G06K 9/00543* (2013.01)

(58) Field of Classification Search
    CPC ............. G06F 13/1673; F02D 41/2409; F02D 41/2425; F02D 41/0007; F02D 2041/286; G05B 23/0221; G11C 21/00; G06K 9/00543
    See application file for complete search history.

(56)        References Cited
            U.S. PATENT DOCUMENTS

2008/0133078 A1*  6/2008  Runde .................. F02D 11/105
                                                          701/84
2010/0174576 A1   7/2010  Naylor
2014/0379992 A1* 12/2014  Dey ................... G06F 12/0808
                                                          711/135

* cited by examiner

METHOD FOR MONITORING THE OPERATION OF A COMPONENT

BACKGROUND AND SUMMARY

The invention relates to a method for monitoring the operation of a component, a control system for monitoring the operation of a component, as well as to a vehicle system comprising such control system. The invention can be applied in heavy-duty vehicles, such as trucks, buses and construction equipment. Although the invention will be described with respect to a truck, the invention is not restricted to this particular vehicle, but may also be used in other vehicles such as trains, passenger cars, etc, as well as in other applications such as marine engines, constructional equipment, aviation industry, etc.

Various mechanical components are subject to loads causing material stress in the components. If the material stress is applied during a certain time it will eventually cause material fatigue in the components whereby the mechanical and/or physical properties of the components will eventually degrade and cause damage or failure of the components.

In vehicles a number of components are subject to conditions exposing them for loads and material stress during operation. One such component is e.g. the turbine wheel of a turbo charger. When the turbine rotates the changes in centrifugal forces will induce expansion or contraction of the turbine wheel in a cyclic manner thus leading to material fatigue in the long run.

A number of techniques for determining the material fatigue have been proposed. One such technique is the so called Rainflow algorithm, which algorithm is designed to calculate the peaks and valleys of a set of data samples representing e.g. the rotational speed of a component. For each cycle, i.e. each subset of data samples extending between two peaks or two valleys the amplitude is stored in a matrix, which matrix is evaluated in order to determine the degree of material fatigue of the component.

One method implementing the Rainflow algorithm onboard is mentioned in US2010/0174576, describing how structural status within vehicle systems may be monitored. A fixed size memory buffer is used for collecting streamed data from system sensors, and peak cycles are used for determining the material fatigue. During real time monitoring the fixed size buffer will eventually be filled with data, thus requiring either i) disregarding new data, or ii) throwing away old data. For performing a reliable monitoring it is required that all data is used. On the other hand the available computing power and memory do not allow for unlimited storage and processing capacity. Hence, there is a need for an improved method for monitoring the operation of a component using fixed size memories without disregarding any data.

It is desirable to provide a method for monitoring the operation of a component, which method overcomes the above mentioned drawbacks of prior art methods.

By the provision of a method which when the buffer is full performs the steps of i) deleting the information relating to the oldest local extrema from the fixed-size buffer; ii) calculating a pseudo cycle formed between two endpoints of which one endpoint is represented by the deleted oldest local extrema; and iii) storing information related to the calculated pseudo cycle in the memory, no important data will be disregarded for determining the fatigue of the component. Hence, a more comprehensive and more reliable monitoring may be achieved.

According to one embodiment, the fixed-size buffer is a ring buffer. Hence, there is no need for a fixed start position in the buffer.

According to one embodiment, the step of storing information relating to each local extremum in a respective position of the buffer is performed such that the information is stored in the same sequential order as the associated local extrema appear in the data sample stream. This is advantageous in that the method may be performed in real time whereby the buffer is continuously updated as the data sample stream is provided.

According to one embodiment, the step of receiving a stream of data samples is performed continuously during operation of the component. Hence, in a vehicle application the method may be performed during the complete running time of the vehicle thus improving the accuracy of the method.

According to an embodiment, the step of storing information related to said cycle in a memory is performed such that said information comprises the amplitudes of the local maxima and the local minima, respectively. This is advantageous in that the method may implement available methods for determining the degree of material fatigue, such as Miner's rule requiring cycle amplitude as input.

According to an embodiment, the step of deleting the local extrema corresponding to at least one of the endpoints of the cycle from the buffer further comprises the step of shifting the respective positions of the remaining information in the buffer such that the remaining information is stored in a consecutive order.

According to an embodiment, the method may further comprise the step of classifying the information related to the cycles in predetermined intervals, wherein each interval is associated with the minimum amplitude and the maximum amplitude of the cycle. This is advantageous in that large amplitude cycles may be associated with a greater impact on material fatigue than small amplitude cycles.

According to an embodiment, the step of storing information related to the cycle in a memory is performed such that the information is stored in a position of the memory being assigned to the interval. The memory may thus be configured as a matrix, wherein each position of the matrix is associated with a specific interval.

According to an embodiment, the step of calculating a pseudo cycle is performed such that the calculated pseudo cycle is classified in an interval being associated with the most probable cycle. In another embodiment, the step of calculating a pseudo cycle is performed such that the calculated pseudo cycle equals a cycle having the highest maximum amplitude and the lowest minimum amplitude. Hence, the method may be performed differently depending on the particular components being monitored.

According to an embodiment, the method may further comprise the step of calculating a value from the information stored in the memory, which value represents a status of the component. The method is thus capable of providing a real time value of the degree of material fatigue of the particular component.

According to an embodiment, the step of calculating a value from the information stored in the memory is performed using Miner's rule.

According to an embodiment, the operation of the component represents the rotational speed of a turbine wheel in a vehicle, and wherein the status represents fatigue of the turbine wheel. This is advantageous in that the method is used for a critical component, which in case of damage affects the overall performance and engine characteristics of the vehicle.

According to an embodiment, the step of calculating a value from the information stored in the memory is repeated during operation of the component, and wherein the method further comprises the step of storing each value. The method may thus be performed onboard a vehicle in real time.

According to an embodiment, the method may further comprise the step of comparing the calculated value with a reference value, which reference value corresponds to component failure. The method is thus capable of not only providing a real time monitoring of the material fatigue of the component, but also to provide an output indicating the current operation of the component relative component failure.

According to an embodiment, the method may further comprise the step of extrapolating the stored values in order to predict maintenance of the component.

According to a second aspect, a computer program comprising program code means is provided for performing, the steps of the method according to the first aspect when said program is run on a computer.

According to a third aspect, a computer readable medium carrying a computer program comprising program code means is provided for performing the steps of the method according to the first aspect when said program product is run on a computer.

According to a fourth aspect, a control unit for monitoring the operation of a component is provided, the control unit being configured to perform the steps of the method according to the first aspect.

According to a fifth aspect, a control system for monitoring the operation of a component is provided.

According to sixth aspect, a vehicle system comprising a control system in accordance with the fifth aspect is provided.

In an embodiment, the vehicle system further comprises a turbine wheel, wherein the receiving unit is configured to receive a stream of data samples representing the actual rotational speed of the turbine wheel.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

DETAILED DESCRIPTION

Figure 1:
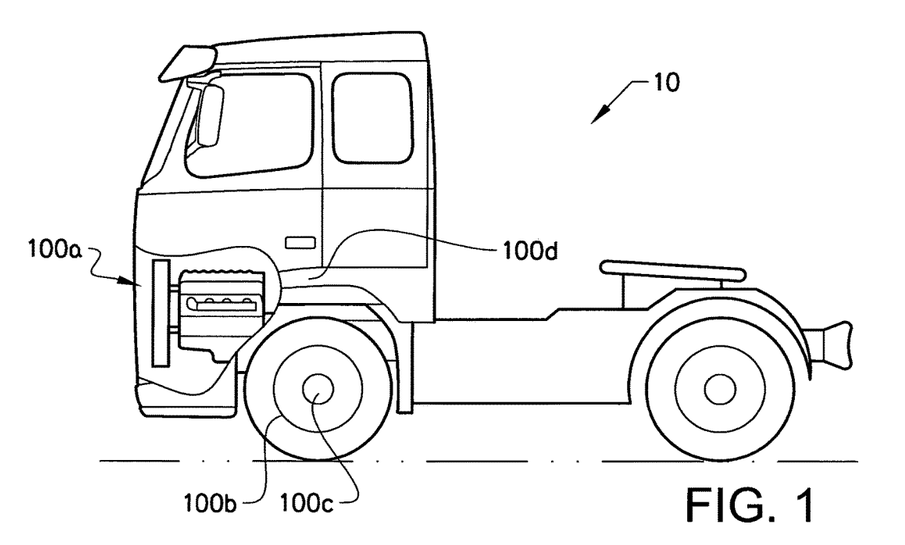
FIG. 1 is a side view of a truck implementing a method according to an embodiment.

Starting with FIG. 1, a truck 10 is shown. The truck 10 is shown to represent a vehicle for which embodiments of the present invention may be implemented and realized. The truck 10 comprises a plurality of vehicle systems 100 such as an engine system 100a, a braking system 100b, a wheel suspension system 100e, a driveline system 100d, etc. Each vehicle system 100a-d may be divided into several subsystems, whereby each subsystem also represents a vehicle system in the context of this description.

Figure 2:
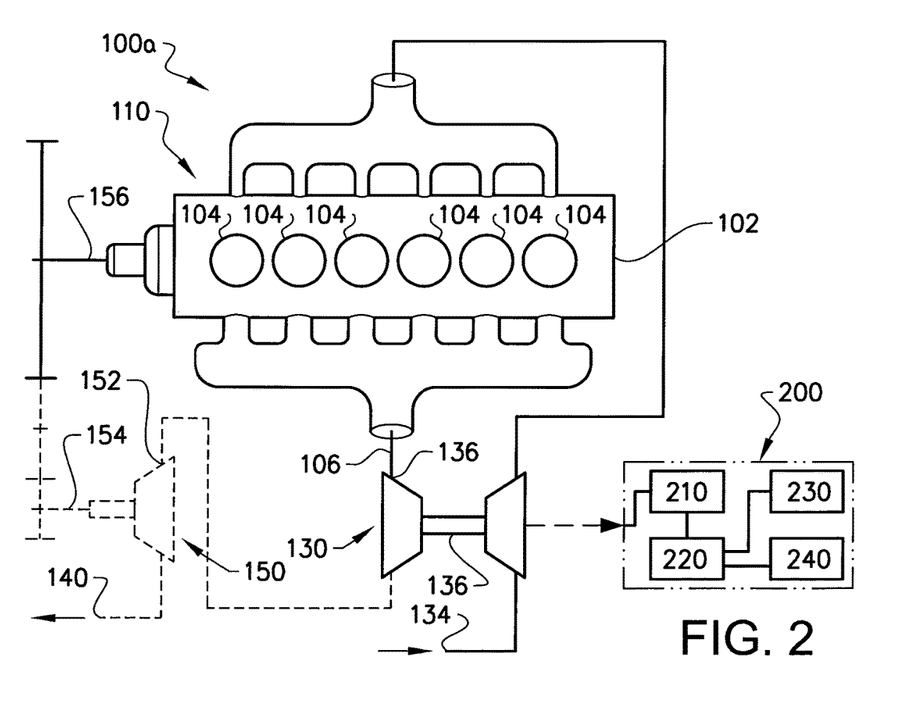
FIG. 2 is a schematic view of a vehicle system according to an embodiment.

For example, the engine system 100a is further shown in FIG. 2. The engine system 100a may either be considered as a complete vehicle system by its own, or as a vehicle system formed by several vehicle systems. The engine system 100a thus comprises an internal combustion system 110 and an aftertreatment system 120. In this context, the aftertreatment system 120 may be considered as a single vehicle system, or as a combination of several vehicle systems. For example, the aftertreatment system 120 may be divided into a turbocharger system 130, an exhaust gas system 140, and a turbocompound system 150. This means that a vehicle system 100 may represent large vehicle systems, such as e.g. the entire engine system 100a, or a smaller system such as e.g. the turbocharger system 130.

The engine system 100a shown in FIG. 2 comprises an engine block 102 having a plurality of cylinders 104. The cylinders 104 are in fluid connection with a manifold 106 for allowing exhaust was to exit the cylinders 104. Hence, the engine block 102, the cylinders 104, as well as the manifold 106 may represent the internal combustion system 110. A turbocharger system 130 includes an exhaust gas inlet 132, an air intake 134, and a turbine 136. Exhaust gas entering the turbocharger system 130 from the manifold 106 will cause the turbine 36 to rotate, thus forcing the intake air to be compressed before entering the cylinders 104. Exhaust gas leaving the turbocharger system 130 may enter a turbocompound system 150, having an exhaust gas inlet 152 and a turbine 154. The exhaust gas entering the turbocompound system 150 will force the associated turbine 154 to rotate, which rotation is further transmitted as a torque increase of a crankshaft 156. An exhaust gas system 140 may be provided in series after the turbocharger system 130, or after the turbocompound system 150 is such is provided. The exhaust gas system 140 may comprise urea injection devices (not shown particle filters (not shown) as well as catalytic reaction chambers (not shown) for reducing the toxic content of the exhaust gas.

In accordance with one embodiment, a control system 200 for monitoring the operation of a turbine wheel of the turbine 136 of the turbocharger system 130 is provided. The control system 200 is configured to continuously, and in real time, monitor the current status of the turbine wheel in terms of material fatigue for allowing service and/or maintenance of the turbine wheel before it is subjected to damage.

The control system 200 is for this purpose programmed to perform various methods, which will be described in further detail below, and comprises a receiving, unit 210 configured to receive a stream of data samples, a processing unit 220 configured to process the data samples of the receiving unit 210, a fixed size buffer 230 for storing temporary data related to the data samples, as well as a memory 240 configured to store information relating to the current material fatigue of the turbine wheel.

The stream of data samples being transmitted to the receiving unit 210 represent a physical parameter of the turbine wheel, and may in some embodiments represent the rotational speed of the turbine wheel. It has been realized that changes in rotational speed of the turbine wheel will cause expansion and contraction due to varying centrifugal forces. Such material stress will induce material fatigue which at a certain degree will cause structural damage to the turbine wheel.

The stream of data samples may either be provided by means of a speed sensor arranged within the turbocharger system 130, or it may be calculated whereby the stream of data samples contain turbine wheel speed estimations.

The processing unit 220 is configured to identify local extrema of the stream of data samples in order to detect cycles, each cycle representing the amplitude difference between two local maxima and one local minimum, or between two local minima and one local maximum.

The processing unit 220 is configured to store the information relating to a local extrema in the fixed-size buffer 230. Once a cycle is detected, the amplitude difference is stored as information in the memory 240 and the oldest local extrema being associated with the cycle is deleted from the fixed-size buffer 230. The control unit 200 is further configured to determine pseudo cycles. Such determination is provided when the fixed size buffer 230 is full, whereby there is no memory available for newly detected local extrema hi such situation, the processing unit 220 is configured to deleting the information relating to the oldest local extrema from the buffer; calculating a pseudo cycle formed between two endpoints of which one endpoint is represented by the deleted oldest local extrema; and storing information related to the calculated pseudo cycle in the memory. Hence, the control unit 200 stores information about every cycle being detected, also in situations when it is not possible to detect the exact amplitude difference of the cycle.

In order to further explain the operation of the control unit 200, reference is made to FIGS. 3a-f and FIGS. 4a-e. Starting with FIGS. 3a-f, the stream of data samples transmitted to the receiving unit 210 is shown together with the fixed-size huller 230. It Should be noted that the description relating to FIGS. 3a-f only shows one example; the stream of data samples could of course represent a completely different behavior for the rotational speed.

Figure 3A:
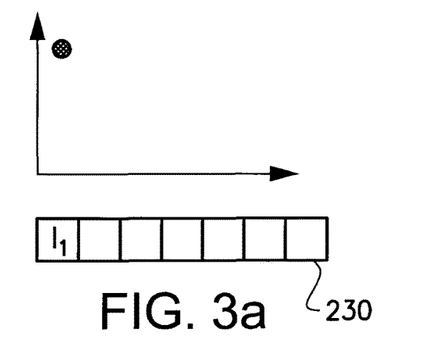
FIGS. 3a-f show a buffer while performing a method according to an embodiment.
Figure 3B:
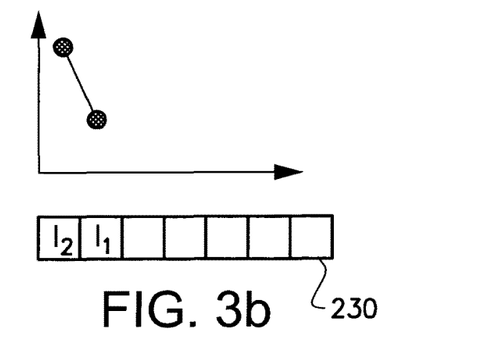
Figure 3C:
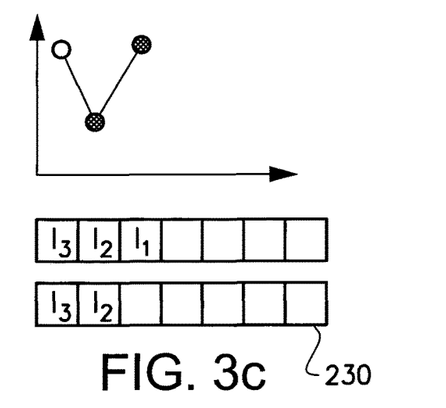
Figure 3D:
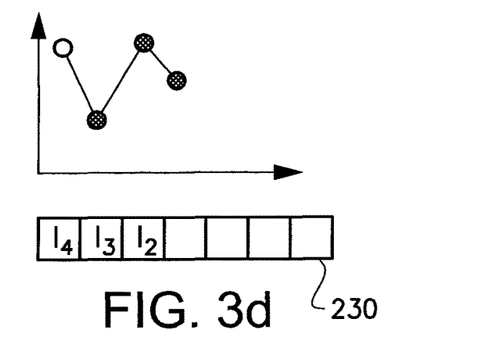
Figure 3E:
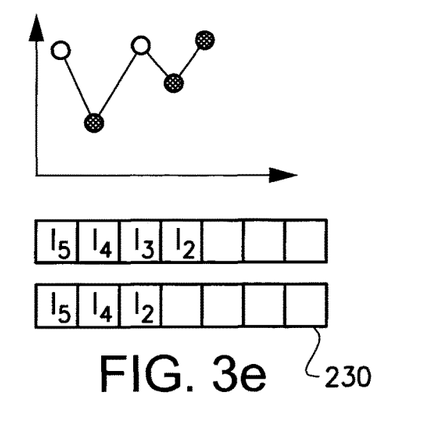
Figure 3F:
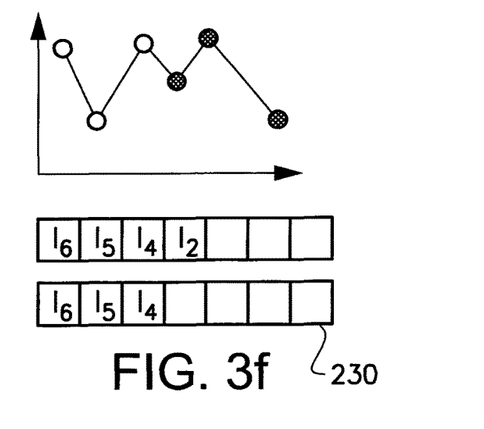

Prior to the situation shown in FIG. 3a, the vehicle is shut down. In such case, there is no stream of data samples and the fixed-size buffer 230 is empty. Once the vehicle is started the receiving unit 210 will start to receive data relating to the rotational speed of the turbine wheel, which is illustrated in the diagram of FIG. 3a. As the first data sample forms a local extremum, the amplitude of the first data sample is stored in the fixed-size buffer as As the stream of data samples is received, the amplitude will eventually change to a second local extremum, shown in FIG. 3b. Upon this, the processing unit 220 will add information representing the second local extremum, i.e. the amplitude representing the rotational speed, to the fixed-size buffer as I2. While continuing receiving data samples representing the rotational speed, a third local extremum is detected as is shown in FIG. 3c. Upon this the processing unit 220 will store information relating to this extremum in the buffer as I3. The processing unit 220 is further configured to check the presence of cycles. As the first local extremum and the third local extremum share the same amplitude, and being separated by at least one local extremum in between, the processing unit 220 confirms that a cycle is formed between ˆ and I3. As a result, information relating to this cycle (i.e. the amplitude difference between \ and I2 or I3 and I2) is stored in the memory 240 of the control unit 200. Following this the processing unit 220 is configured to delete the information relating to the first local extremum since this local extremum has already contributed to a stored cycle. The stream of data samples continues, and in FIG. 3d a fourth local extremum is identified and detected. Consequently, information representing this local extremum is stored in the buffer 230 as I4. Since the fourth local extremum is arranged at different amplitude as the second local extremum, the processing unit 220 does not detect a cycle. In FIG. 3e a fifth local extremum is identified and detected, and information relating to this local extremum is stored in the buffer as I5. The processing unit 220 determines that a cycle is formed between the third and the fifth local extremum, whereby the starting point, i.e. I3, is deleted from the buffer 230 and information representing this particular cycle is stored in the memory 240. Now turning to FIG. 3f a sixth local extremum is detected, and information representing this local extremum is stored in the buffer as I6. The processing unit 220 identifies a cycle formed between the second local extremum and the sixth local extremum, because they share the same amplitude. Hence, information relating to this cycle is stored in the memory 240, and the starting point. i.e. I2, is deleted from the buffer 230. As is evident from above, the processing unit 220 may be configured to identify cycles according to user preferences. For example, three local extrema may be considered as forming a cycle if the amplitudes of the two endpoints are in the same interval as will be further described below with reference to FIG. 5.

Figure 4A:
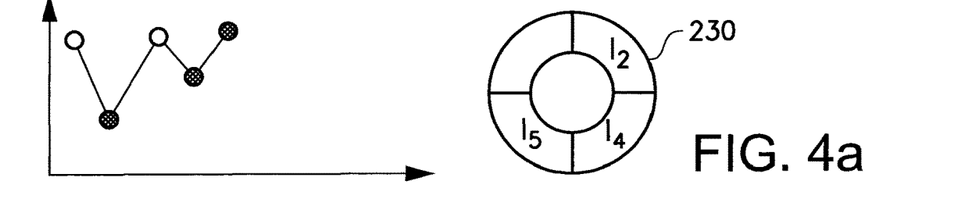
FIGS. 4a-e show a ring buffer while performing a method according to an embodiment.
Figure 4B:
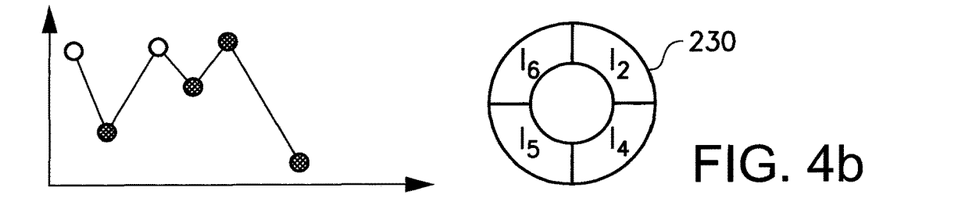

Now turning, to FIGS. 4a-e, the operation of the control unit 220 will be described in further detail. In these figures, the buffer 230 is shown as a fixed-size ring buffer with four memory cells. FIG. 4a shows the same situation as previously been described with reference to FIGS. 3a-e, i.e. where two cycles have been identified and the buffer 230 holds information relating to the second, fourth, and fifth local extremum. When a sixth local extremum is detected as is shown in FIG. 4b, the processing unit 220 will not identify a cycle. Hence, information I6 is stored in the last available cell of the buffer. When the next local extremum is detected from the stream of data samples there will be no free space in the buffer to store associated information I7. The processing unit 220 is in this situation configured to identify the oldest information in the buffer 230, which in this particular case is I2. The processing unit then calculates a pseudo cycle using, this information, and stores information relating to the pseudo cycle in the memory 240 before I2 is deleted from the buffer 230. The pseudo cycle may e.g. be calculated as a worst case cycle, which corresponds to a cycle extending between the highest possible maximum amplitude and the lowest minimum-amplitude. In other embodiment the pseudo cycle may be calculated as a median cycle, or as the most probable cycle. In order to calculate the most probable cycle, it has been realized that low-amplitude cycles are most frequent while the frequency decreases as the amplitude difference between minima and maxima increases. Hence, for each starting point the cycles are distributed across the possible amplitudes. As one extrema is known, it is then possible to estimate the most probable cycle by applying a random function and using the known starting point, as well as the distribution of cycles across possible amplitudes, as input.

Figure 4C:
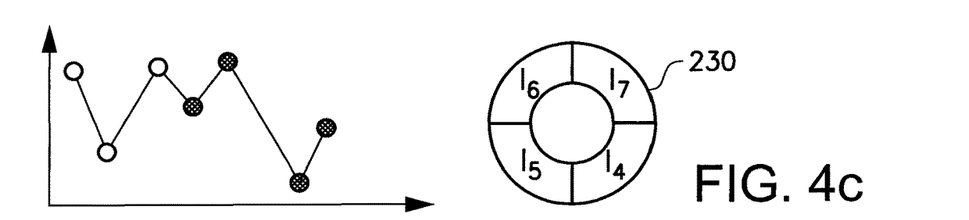
Figure 4D:
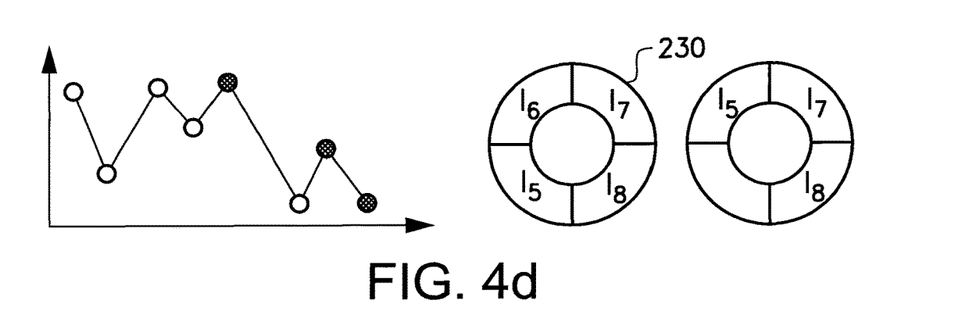
Figure 4E:
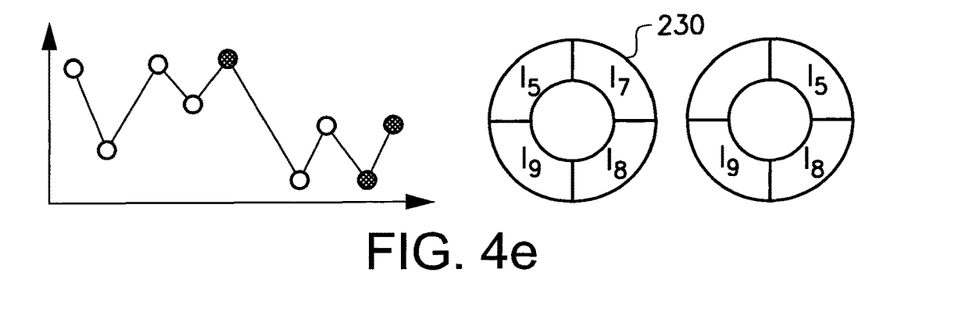

When this is done, there is again free space in the buffer 230 for storing information I7. This is shown in FIG. 4c. As the rotational speed continues to change, a further local extremum is detected. However, the buffer 230 is again full, whereby a pseudo cycle is calculated from the oldest information, in this case I4. Information associated with this pseudo cycle is stored in the memory 240, whereby there is room for storing information I8 relating to the eight local extremum. As can be seen in FIG. 4d, at this point the processing, unit 220 identifies a cycle formed between the sixth and the eight local extremum, whereby information relating to this cycle is stored in the memory 240. Consequently, the starting point, represented as I6, is deleted from the buffer 230. In FIG. 4e a yet further local extremum is detected and identified by the processing unit 220. Information relating to this local extremum is stored in the buffer as I9, and the processing unit. 220 then detects a cycle formed between the seventh and ninth local extremum. Consequently, information relating to this cycle is stored in the memory 240, whereby the starting point I7 is deleted from the buffer 230.

From above it is clear that no critical information, i.e. information relating to local extrema of the stream of data samples, is thrown away without contributing to the information stored in the memory 240.

Figure 5:
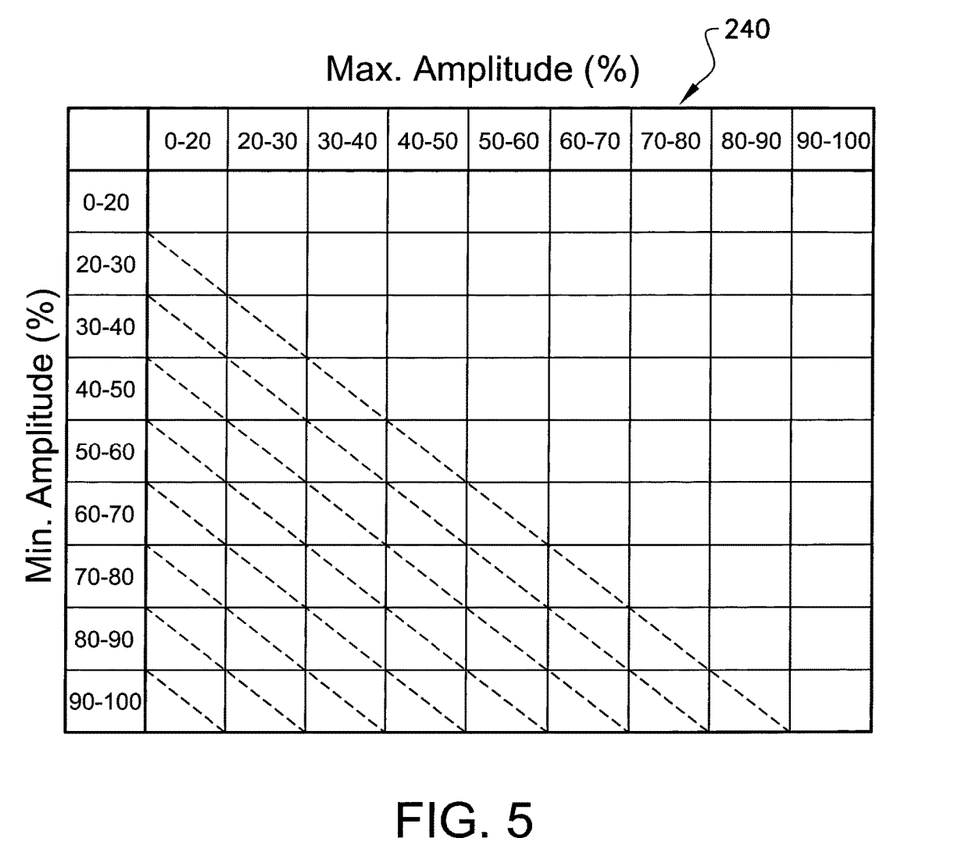
FIG. 5 shows a memory for use with a method according to an embodiment.

Now turning to FIG. 5 a schematic view of a memory 240 is shown. The memory 240 is designed to form a representation of the current status of the turbine wheel, and can thus be used for monitoring the operation of the turbine wheel in real time. The memory 240 is constructed as a matrix, wherein each position in the matrix stores a scalar representing the occurrence of predefined cycles. The columns of the matrix represent the maximum amplitude of the cycle, while the rows represent the minimum amplitude of the cycle. As the maximum amplitude will always be greater than the minimum amplitude, only half of the matrix will be used.

The processing unit 220 stores information relating to each cycle in the memory 240. Such information comprises the maximum amplitude, and the minimum amplitude. As is shown in FIG. 5 the matrix has nine columns and nine rows generally corresponding to 10% intervals, however the exact number may of course vary. For example, a cycle extending from very low amplitude to very high amplitude may provide a higher impact to the material fatigue, whereby it may be suitable to have more narrow intervals for high amplitudes. Further, the predefined intervals of the memory 240 are preferably normalized, such that the maximum possible amplitude is 100%.

When the processing unit 220 determines that a cycle is formed, it is further configured to increase a scalar of a corresponding matrix position. For example, if the amplitude of a cycle is determined, to extend from 32% to 74%, the corresponding matrix position is identified as line 3, column 7. The value of that position, is accordingly increased by adding "I" to the previous value. As the vehicle is running the matrix will be continuously updated with increasing values at respective positions.

The matrix of the memory 240 may be evaluated at predetermined intervals for monitoring the operation of the turbine wheel. The processing unit 220 may be configured to evaluate the matrix each time new information is stored in the memory 240, or at certain occasions such as every 100 hours of driving, once a week, etc. Evaluation may be made by available algorithms, such as Miner's rule resulting in a scalar representing the current degree of material fatigue. Other known algorithms may be used as well.

The evaluation of the matrix may for example result in a scalar between 0 and 1, where 1 is assumed to represent fracture or failure of the component. By evaluating the matrix at regular intervals the processing unit 220 is configured to store the resulting scalar in a further memory, whereby the processing unit 220 is configured to predict a future time when the resulting scalar equals 1 by extrapolating the stored scalars from previous evaluations. Hence, the processing unit 220 may predict maintenance of the component for reducing the risk of component malfunction.

Figure 6:
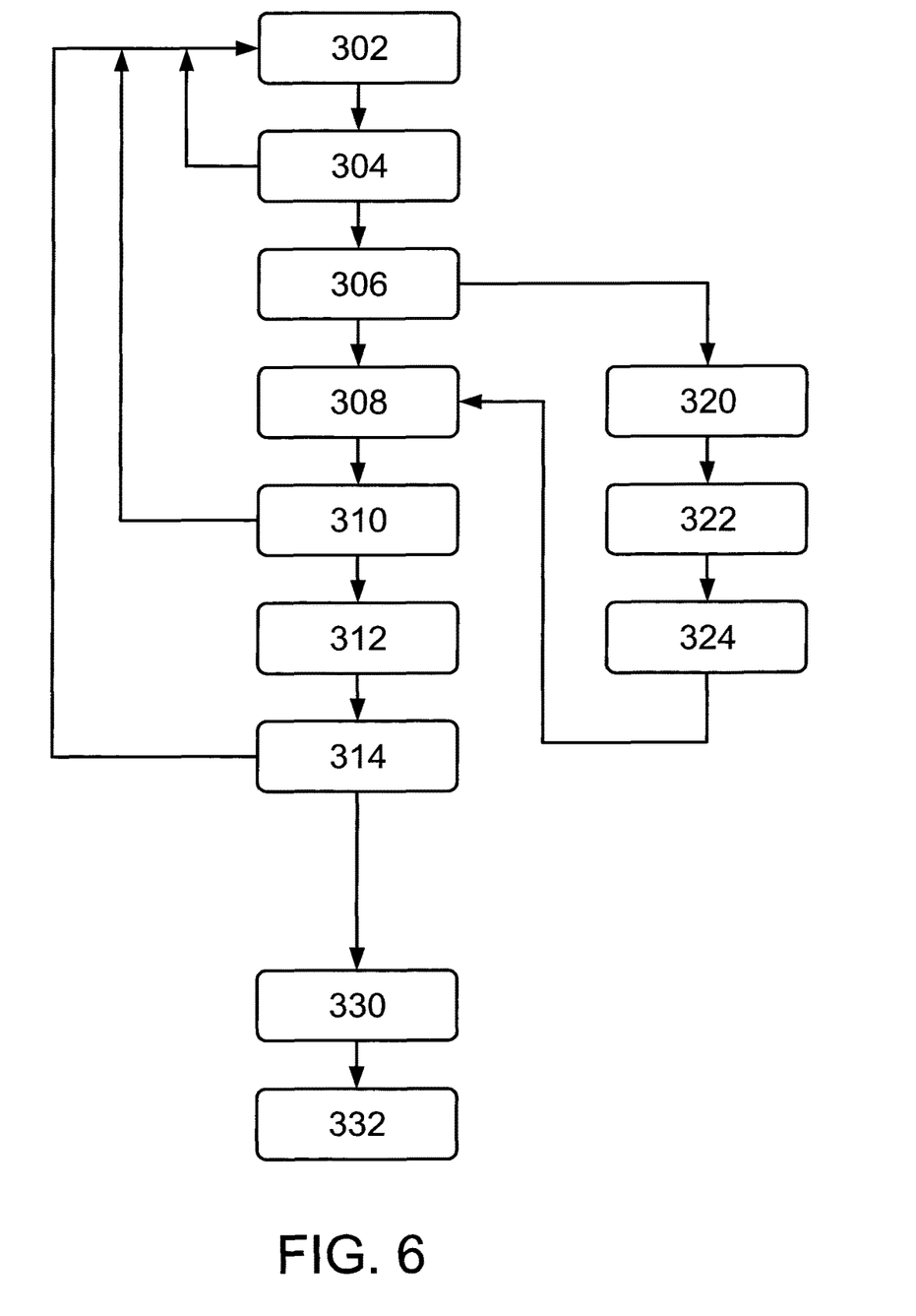
FIG. 6 is a schematic view of a method according to an embodiment.

Now turning to FIG. 6, different embodiments of a method 300 for monitoring the operation of a component will be described. Starting with step 302 a stream of data samples is received, e.g. by means of a receiving unit 210. Each data sample represents a value of a physical parameter of the component, such as the rotational speed of a turbine wheel of a turbocharger unit 130. In a subsequent step 304 the stream of data samples is analyzed in order to identify a local extrema of said stream of data samples. If no local extrema is identified, the method returns to step 302. If a local extrema is identified, a step 306 is performed in which the buffer is accessed in order to determine if there is any free memory cell. If the buffer is not full, a step 308 is performed in which information relating to such local extrema is stored in a position of a fixed size buffer. The information comprises a value of the associated amplitude, e.g. the rotational speed. If the buffer is full, the method jumps to step 320 which will be described later.

After step 308, the method proceeds to step 310 in which the method checks if a cycle is formed between two matching endpoints represented by two local maxima or two local minima. If not, the method returns to step 302. If a cycle is formed, the method proceeds with a step 312 in which the local extrema corresponding to the starting point of the cycle is deleted from the buffer, and a step 314 in which information related to said cycle is stored in a memory such that the information stored in the memory represents the operation of the component. The method will thereafter return to step 302 for repeating the method as long as new data samples are received.

If the buffer is full after step 306, the method performs a step 320 in which information relating to the oldest local extrema is deleted from the buffer in order to free space for the newly identified local extrema. Step 320 is followed by a step 322 in which a pseudo cycle is calculated as being formed between two endpoints of which one endpoint is represented by the deleted oldest local extrema, and a step 324 in which information related to the calculated pseudo cycle is stored in the memory. When this is done, the method proceeds to step 308 for storing information relating to the new local extrema in the buffer.

The steps 314 and 324 of storing information relating to the cycles may comprise that the information is classified in predetermined intervals, wherein each interval is associated with the minimum amplitude and the maximum amplitude of the extrema. Such classification may e.g. be made in accordance with the amplitude intervals shown in FIG. 5, such that each cycle (either determined or calculated as a pseudo cycle) is assigned to a specific interval.

Further, step 322 of calculating the pseudo cycle may be performed such that the calculated pseudo cycle represent the cycle having the highest impact on fatigue. In other embodiment, the pseudo cycle may be calculated as a median cycle, or as the most probable cycle.

Step 314 may be followed by a step 330, in which the information stored in the memory is evaluated for resulting in a value, which value represents a status of the component. Such step may be performed by implementing, e.g. Miner's rule.

Step 330 may be repeated during operation of the component, whereby the method 300 further comprises a step 332 of analyzing pervious values representing the status of the component by comparing the calculated values with a reference value, which reference value corresponds to a critical operation of the component. Step 332 may also comprise extrapolating the stored values in order to predict maintenance of the component.

In an embodiment the information stored in the buffer 230, as well as the information stored in the memory 240 is not erased when shutting down the system. For example in vehicle applications, each time the vehicle is restarted the buffer 230 will contain the same information as when it was shut-off. By keeping the buffer, as well as the memory, intact also upon restarting there will never be lost data.

Although the above description has been made mostly with respect to a turbine wheel of a turbocharger in a vehicle, the embodiments described may be used for many different kinds of mechanical components being subject to cyclic loads, not only within automotive systems.

It is to be understood that the present invention is not limited to the embodiments described above and illustrated in the drawings; rather, the skilled person will recognize that many changes and modifications may be made within the scope of the appended claims.

The invention claimed is:

1. A method for monitoring the operation of a component, comprising the steps of: receiving a stream of data samples, wherein each data sample represents a value of a physical parameter of the component;
    identifying local extrema of the stream of data samples,
        storing information relating to each local extremum in a respective position of a fixed size buffer; and
    upon the presence of a cycle formed between two matching endpoints represented by two local maxima or two local minima:
    i) deleting at least one of the local extrema corresponding to the endpoints of the cycle from the buffer; and
    ii) storing information related to the cycle in a memory such that the information stored in the memory represents the operation of the component;
wherein
    when the buffer is full such that each position of the buffer contains information relating to a unique local extrema, the method further comprises the steps of:
    i) deleting the information relating to the oldest local extrema from the buffer;
    ii) calculating a pseudo cycle formed between two endpoints of which one endpoint, is represented by the deleted oldest local extrema; and
    iii) storing information related to the calculated pseudo cycle in the memory.

2. The method according to claim 1, wherein the fixed-size buffer is a ring buffer.

3. The method according to claim 1, wherein the step of storing information relating to each local extremum in a respective position of the buffer is performed such that the information is stored in the same sequential order as the associated local extrema appear in the data sample stream.

4. The method according to claim 1, wherein the step of receiving a stream of data samples is performed continuously during operation of the component.

5. The method according to claim 1, wherein the step of storing information related to the cycle in a memory is performed such that the information comprises the amplitudes of the local maxima and the local minima, respectively.

6. The method according to claim 1, wherein the step of deleting the local extrema corresponding to at least one of the endpoints of the cycle from the buffer further comprises the step of shifting the respective positions of the remaining information in the buffer such that the remaining information is stored in a consecutive order.

7. The method according to claim 1, further comprising the step of classifying the information related to the cycles in predetermined intervals, wherein each interval is associated with the minimum amplitude and the maximum amplitude of the cycle.

8. The method according to claim 7, wherein the step of storing information related to the cycle in a memory is performed such that the information is stored in a position of the memory being assigned to the interval.

9. The method according to claim 7, wherein the step of calculating a pseudo cycle is performed such that the calculated pseudo cycle is classified in an interval being associated with the highest maximum amplitude and the lowest minimum amplitude.

10. The method according to claim 1, wherein the step of calculating a pseudo cycle is performed such that the calculated pseudo cycle equals a most probable cycle.

11. The method according to claim 1, further comprising the step of calculating a value from the information stored in the memory, which value represents a status of the component.

12. The method according to claim 11, wherein the step of calculating a value from the information stored in the memory is performed using Miner's rule.

13. The method according to claim 11 or 12, wherein the operation of the component represents the rotational speed of a turbine wheel in a vehicle, and wherein the status represents fatigue of the turbine wheel.

14. The method according to claim 11, wherein the step of calculating a value from the information stored in the memory is repeated during operation of the component, and wherein the method further comprises the step of storing each value.

15. The method according to claim 14, further comprising the step of comparing the calculated value with a reference value, which reference value corresponds to component failure.

16. The method according to claim 15, farther comprising the step of extrapolating the stored values in order to predict maintenance of the component.

17. A computer comprising a program for performing the steps of claim 1 when the program is run on the computer.

18. A non-transitory computer readable medium carrying a computer program for performing the steps of claim 1 when the program product is run on a computer.

19. A control unit for monitoring the operation of a component, the control unit being configured to perform the steps of the method according to claim 1.

20. A control system for monitoring the operation of a component, comprising a receiving unit configured to receive a stream of data samples, wherein each data sample represents a value of a physical parameter of the component; and a processing unit configured to identifying local extrema of the stream of data samples, storing information relating to each local extremum in a respective position of a fixed-size buffer; and identifying a cycle formed between two matching endpoints represented by two local maxima or two local minima, wherein the processing unit further configured to deleting at least one of the local extrema corresponding to the endpoints of the cycle from the buffer; and storing information related to the cycle in a memory such that the information stored in the represents the operation of the component;
wherein
    when the buffer is full such that each position of the buffer contains information relating to a unique local extrema, the processing unit is further configured to deleting the information relating to the oldest local extrema from the buffer; calculating a pseudo cycle formed between two endpoints of which one endpoint is represented by the deleted oldest local extrema; and storing information related to the calculated pseudo cycle in the memory.

21. A vehicle system, comprising a control system according to claim 20.

22. The vehicle system according, to claim 21, further comprising a turbine wheel, wherein the receiving unit is configured to receive a stream of data samples representing the actual rotational speed of the turbine wheel.

* * * * *